United States Patent
Kwon et al.

(10) Patent No.: US 8,604,813 B2
(45) Date of Patent: Dec. 10, 2013

(54) BUILT-OFF TEST DEVICE AND TEST SYSTEM INCLUDING THE SAME

(75) Inventors: Hyuk Kwon, Asan-si (KR); Hyoung-Young Lee, Yongin-si (KR); Sang-Do Han, Cheonan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 439 days.

(21) Appl. No.: 12/900,748

(22) Filed: Oct. 8, 2010

(65) Prior Publication Data

US 2011/0115517 A1   May 19, 2011

(30) Foreign Application Priority Data

Nov. 13, 2009   (KR) .................. 10-2009-0109438

(51) Int. Cl.
  *G01R 31/3187* (2006.01)
  *G01R 31/26* (2006.01)
(52) U.S. Cl.
  USPC .................. 324/750.3; 324/762.01
(58) Field of Classification Search
  None
  See application file for complete search history.

(56) References Cited

U.S. PATENT DOCUMENTS

| | | | |
|---|---|---|---|
| 2010/0153792 A1* | 6/2010 | Jang | 714/700 |
| 2010/0289517 A1* | 11/2010 | Oh et al. | 324/765 |

FOREIGN PATENT DOCUMENTS

| | | |
|---|---|---|
| JP | 11-237433 | 8/1999 |
| JP | 2008-145266 | 6/2008 |
| JP | 2008-224585 | 9/2008 |
| KR | 1020060048345 | 5/2006 |

OTHER PUBLICATIONS

Translation of JP2008-224585, Takeshita, Published Sep. 25, 2008.*
JP 2006-030166 is a translation of KR 1020060048345, Shimizu et al, Published May 18, 2006.*

\* cited by examiner

*Primary Examiner* — Jermele M Hollington
(74) *Attorney, Agent, or Firm* — F. Chau & Associates, LLC

(57) ABSTRACT

A built-off test (BOT) device includes a signal processing block, an output selection block and a signal control block. The signal processing block duplicates a test signal to apply a plurality of duplicated test signals to each of a plurality of devices under test (DUTs) through each of corresponding channels, and the signal processing block provides a plurality of decision signals based upon a plurality of test result signals received from each of the DUTs. The output selection block merges the decision signals as a final decision signal or sequentially outputs the decision signals as the final decision signal, in response to an output mode selection signal. The signal control block provides the test signal to the signal processing block or provides the final decision signal externally, in response to a first switching control signal.

12 Claims, 14 Drawing Sheets

FIG. 4A

| TS(REF) | TRS | DS |
|---------|-----|---------|
| 0 | 0 | 0(PASS) |
| 0 | 1 | 1(FAIL) |
| 1 | 0 | 1(FAIL) |
| 1 | 1 | 0(PASS) |

FIG. 4B

| TS(REF) | TRS | DS |
|---------|-----|---------|
| 0 | 0 | 1(PASS) |
| 0 | 1 | 0(FAIL) |
| 1 | 0 | 0(FAIL) |
| 1 | 1 | 1(PASS) |

BUILT-OFF TEST DEVICE AND TEST SYSTEM INCLUDING THE SAME

CROSS-REFERENCE TO RELATED APPLICATION

This application claims under 35 USC §119 priority to and the benefit of Korean Patent Application No. 10-2009-0109438, filed on Nov. 13, 2009 in the Korean Intellectual Property Office (KIPO), the entire content of which is incorporated by reference herein.

BACKGROUND

1. Technical Field

The present disclosure relates to semiconductor devices, and, more particularly, to a test device of semiconductor memory devices.

2. Discussion of the Related Art

Automatic test equipment (ATE) is used for testing semiconductor devices, and ATEs are required to have performance suitable for testing the semiconductor devices. As the performance expectations of the semiconductor devices become more and more enhanced and the operating speed of the semiconductor devices becomes faster and faster, a built-off test (BOT), where the test functionality is brought to the closest possible proximity of the device-under-test (DUT), e.g., to a load board, has been employed. However, the conventional BOT can have various problems, such as extended test times, particularly when the number of DUTs being tested increases.

SUMMARY

Exemplary embodiments provide both a BOT device capable of increasing test coverage without increasing test time and a test system that includes the BOT device.

According to an exemplary embodiment, a BOT device includes a signal processing block configured to duplicate a test signal, to apply a plurality of duplicated test signals to each of a plurality of DUTs through each of corresponding channels, and to provide a plurality of decision signals based upon a plurality of test result signals being received from each of the DUTs. An output selection block is configured to merge the decision signals as a final decision signal or to sequentially output the decision signals as the final decision signal, in response to an output mode selection signal. A signal control block is configured to provide the test signal to the signal processing block or to provide the final decision signal externally, in response to a first switching control signal.

The signal processing block may include a plurality of signal processing units, each of the signal processing units having a buffer that duplicates the test signal to provide the duplicated test signal, a relay that provides the duplicated test signal to the corresponding DUT when a second switching control signal is at a first logic level, a comparison circuit that compares the corresponding test result signal with a reference level to provide the corresponding decision signal when the second switching control signal is at a first logic level, and a register that stores and outputs the decision signal.

The buffer may be provided with first and second power supply voltages, and a voltage level of the duplicated test signal may be adjustable according to the first and second power supply voltages.

The decision signal stored in the register may be provided to the output selection block when a test of all the DUTs is completed.

The comparison circuit may be provided with third and fourth power supply voltages, and a voltage level of the decision signal may be adjustable according to the third and fourth supply voltages.

The comparison circuit may provide a decision signal that indicates a failed test when the test result signal is the same as the reference level.

The comparison circuit may provide a decision signal that indicates a failed test when the test result signal is different from the reference level.

The output selection block may merge the test result signals as the final decision signal when the output mode selection signal is at a first logic level, and may sequentially output the test result signals as the final decision signal when the output mode selection signal is at a second logic level.

The output selection block may include a merging circuit configured to receive and merge the plurality of decision signals, a multiplexer configured to select and sequentially output one of the plurality of decision signals in response to a selection signal, a counter that generates the selection signal, and a relay connected to an output of the merging circuit when the output mode selection signal is at the first logic level, and connected to an output of the multiplexer when the output mode selection signal is at the second logic level.

The merging circuit may include an OR gate that outputs the final decision signal of a first logic level that indicates a failed test when at least one of test signals is at the first logic level.

The merging circuit may include an AND gate that outputs the final decision signal of a second logic level that indicates a failed test when at least one of test signals is at the second logic level.

The output selection block may include a merging circuit configured to be selectively enabled in response to the output mode selection signal and to receive and merge the plurality of decision signals, a multiplexer configured to be selectively enabled in response to the output mode selection signal and to select and sequentially output one of the plurality of decision signals in response to a selection signal, and a counter which is selectively enabled in response to the output mode selection signal and generates the selection signal.

The merging circuit may be enabled when the output mode selection signal is at the first logic level, and the multiplexer and the counter may be enabled when the output mode selection signal is at the second logic level.

According to an exemplary embodiment, a test system includes a test device configured to generate a plurality of test signals that correspond to each of a plurality of test parameters, a BOT module configured to duplicate the test signals, to apply a plurality of duplicated test signals to each of a plurality of DUTs through each of corresponding channels, and to provide a plurality of decision signals based upon a plurality of final test result signals received from each of the DUTs, and a test board connected to the BOT module through the channels, the DUTs being mounted on the test board.

The test device may include a plurality of signal generating circuits configured to generate the test signals and to receive the final test result signals. Each of the signal generating circuits may include a test pattern generator configured to generator a test pattern, a buffer which buffers the test pattern to output the test signal, a first relay that provides the test signal to the BOT module when a first switching control signal is at a first logic level, and a comparison circuit that compares the corresponding final test result signal with a reference level to provide a final result signal when the first switching control signal is at a second logic level.

The BOT module may include a plurality of BOT units, each of the BOT units including a signal processing block configured to duplicate corresponding ones of the test signals, to apply a plurality of duplicated test signals to each of DUTs, and to provide a plurality of decision signals based upon a plurality of test result signals from the corresponding DUT, an output selection block configured to merge or to sequentially output corresponding decision signals as a corresponding final decision signal, in response to an output mode selection signal, and a signal control block configured to provide the corresponding test signal to the signal processing block or to provide the final decision signal to the test device, in response to a second switching control signal.

The plurality of test signals may be simultaneously determined as pass or fail.

The BOT module may be mounted on the test board.

The BOT module may be mounted on the test device.

According to an exemplary embodiment, an apparatus for testing multiple semiconductor devices includes a signal processor coupled through respective channels to a plurality of semiconductor devices. A signal controller is configured to, in response to a switching control signal, selectively supply to the signal processor a common test signal for processing by each of the plurality of semiconductor devices, or externally provide a final decision signal based upon the common test signal having been processed by the semiconductor devices. An output selector is configured to, in response to an output mode selection signal, provide the final decision signal to the signal controller. The final decision signal is either a one by one sequence of test result decision signals or a merger of the test result decision signals to indicate a failed test of at least one of the semiconductor devices. Each test result decision signal is based upon a comparison between a reference level and a test result signal from a respective semiconductor device having processed the common test signal.

Accordingly, the BOT device according to exemplary embodiments may reduce test time when a number of DUTs increases by duplicating limited test signals to provide the duplicated test signals to DUTs, simultaneously determining the test result signals from the DUTs and providing the final decision signal to the test device after the test is completed.

BRIEF DESCRIPTION OF THE DRAWINGS

Illustrative, non-limiting exemplary embodiments will be more clearly understood from the following detailed description taken in conjunction with the accompanying drawings.

FIGS. 4A and 4B are tables illustrating the decision signal of FIGS. 3A and 3B based upon the test result signal and the reference level respectively.

DETAILED DESCRIPTION OF THE EMBODIMENTS

Figure 1:
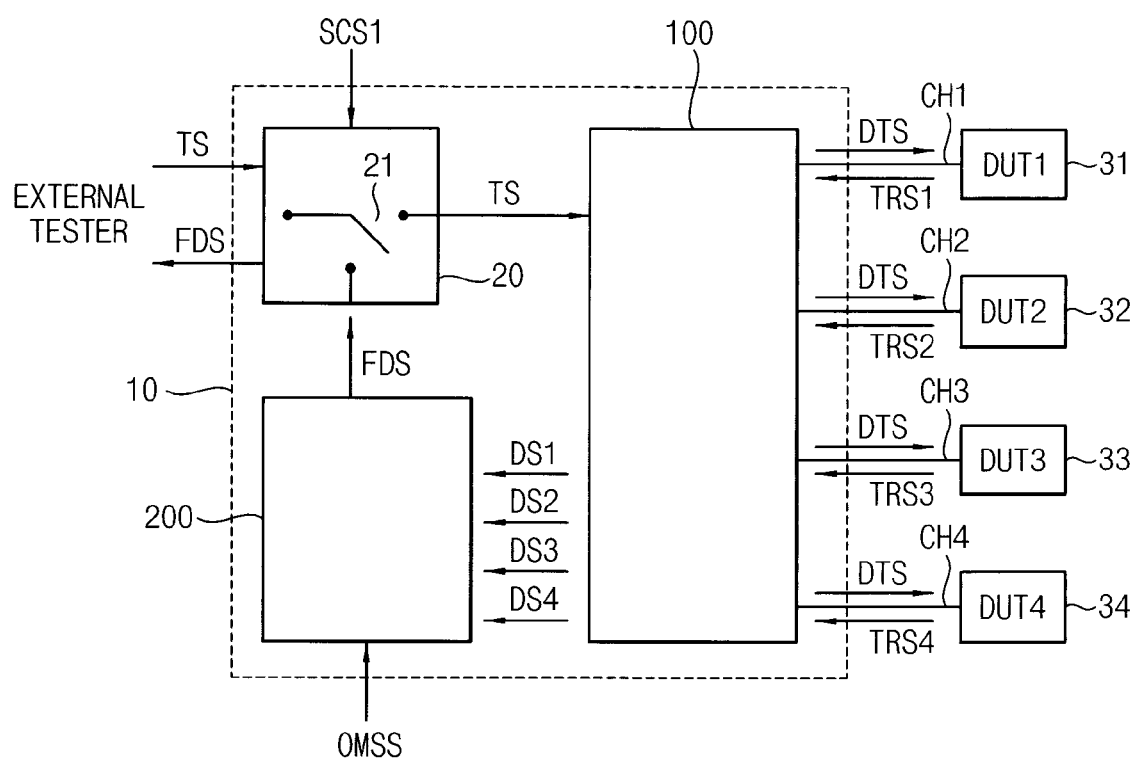
FIG. 1 is a block diagram illustrating a BOT device according to an exemplary embodiment.

Various exemplary embodiments will be described more fully hereinafter with reference to the accompanying drawings, in which exemplary embodiments are shown. The present inventive concept may, however, be embodied in many different forms and should not be construed as limited to the exemplary embodiments set forth herein. In the drawings, the sizes and relative sizes of areas or regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present.

FIG. 1 is a block diagram illustrating a BOT device according to an exemplary embodiment.

In FIG. 1, a plurality of DUTs 31, 32, 33, 34 are illustrated together for convenience of explanation.

Referring to FIG. 1, a BOT device 10 includes a signal processing block 100, an output selection block 200 and a signal control block 20.

The signal control block 20 includes a relay 21, and the relay 21 is selectively connected to one of the signal processing block 100 and the output selection block 200 in response to a logic level of a first switching control signal SCS1. In an exemplary embodiment, when the first switching control signal SCS1 is at a first logic level (logic high level), the relay 21 is connected to the signal processing block 100, and the signal control block 20 may provide a test signal TS from an external tester (not illustrated) to the signal control block 20 in some embodiments. In an exemplary embodiment, when the first switching control signal SCS1 is at second logic level (logic low level), the relay 21 is connected to the output selection block 200, and the signal control block 20 may provide a final decision signal FDS to the external tester. In other exemplary embodiments, the relay 21 may be connected to the signal processing block 100 when the first switching control signal SCS1 is at the second logic level, and the relay 21 may be connected to the output selection block 200, when the first switching control signal SCS1 is at the first logic level.

The signal processing block 100 receives the test signal TS, and duplicates the test signal TS to provide each of a plurality of duplicated test signals DTS to each of the DUTs 31, 32, 33, 34 through each of a plurality of channels CH1, CH2, CH3, CH4. In addition, the signal processing block 100 receives each of test result signals TRS1, TRS2, TRS3, TRS4 from each of the DUTs 31, 32, 33, 34, and provides a plurality of decision signals DS1, DS2, DS3, DS4 to the output selection block 200 based upon the received test result signals TRS1, TRS2, TRS3, TRS4. Architectural and operational details of the signal processing block 100 will be described below with reference to FIG. 2.

The output selection block 200 merges the decision signals DS1, DS2, DS3, DS4 to provide a final decision signal FDS or the output selection block 200 sequentially provides the decision signals DS1, DS2, DS3, DS4 as the final decision signal FDS, in response to an output mode selection signal OMSS. Architectural and operational details of the output selection block 200 will be described below with reference to FIG. 4.

Figure 2:
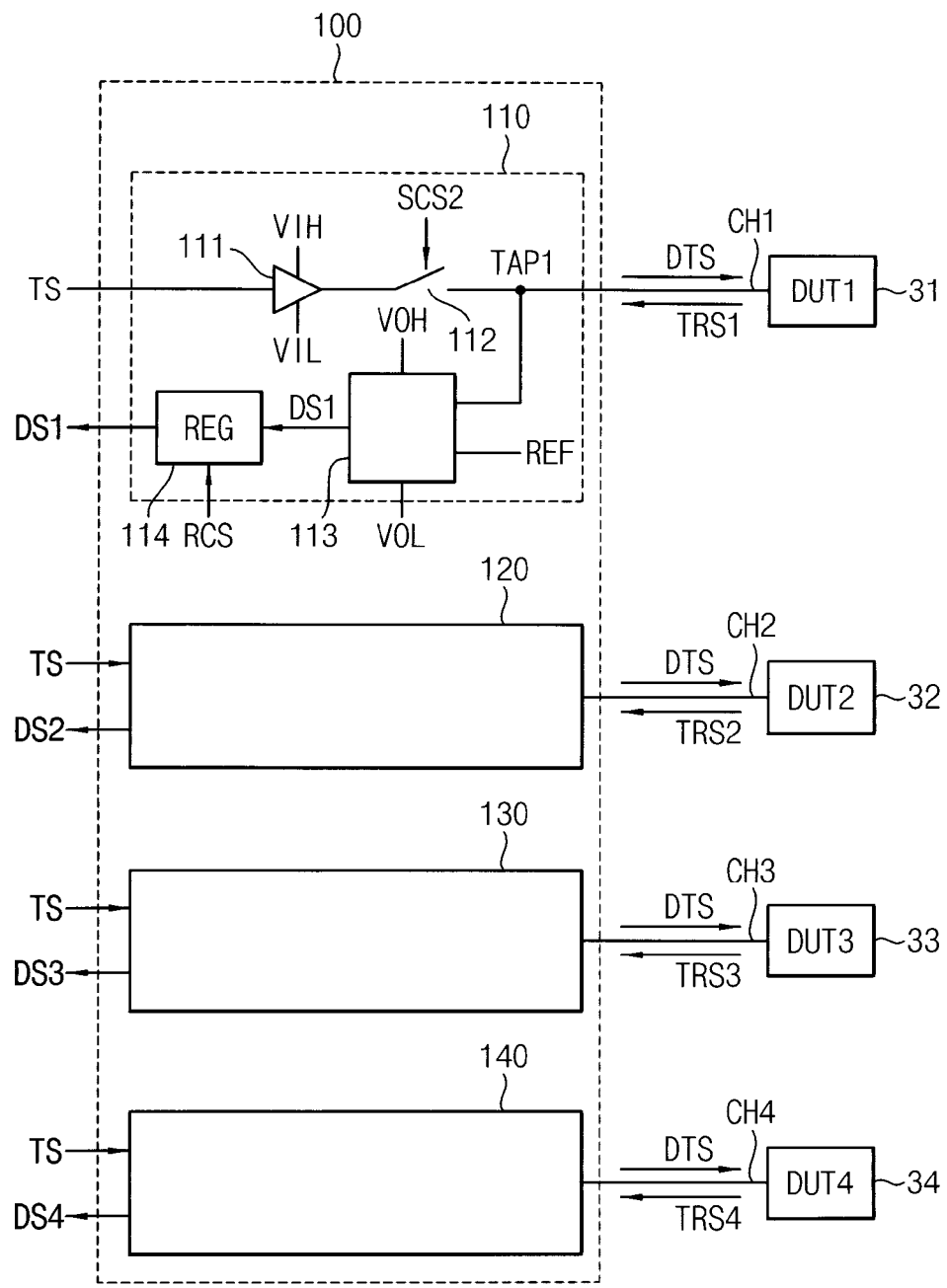
FIG. 2 is a block diagram illustrating an exemplary embodiment of the signal processing block of FIG. 1.

FIG. 2 is a block diagram illustrating an exemplary embodiment of the signal processing block of FIG. 1 according to an exemplary embodiment. In FIG. 2, the plurality of DUTs 31, 32, 33, 34 are illustrated together for convenience of explanation.

Referring to FIG. 2, a signal processing block 100 includes a plurality of signal processing units 110, 120, 130, 140. Each of the signal processing units 110, 120, 130, 140 is connected to a respective one of the DUTs 31, 32, 33, 34 through a respective one of the channels CH1, CH2, CH3, CH4. In FIG. 2, the signal processing unit 110 is illustrated in detail, and each of the other signal processing units 120, 130, 140 may have substantially the same structure as the signal processing unit 110. In addition, although the signal processing block 100 includes four signal processing units 110, 120, 130, 140, the signal processing block 100 may include more or less than four signal processing units. Therefore, the test signal TS may be duplicated without limitation as to particular amounts of branches.

The signal processing unit 110 includes a buffer 111, a relay 112, a comparison circuit 113 and a register 114.

The buffer 111 buffers (or duplicates) the test signal TS to output a duplicated test signal DTS. The buffer 111 is provided with first and second power supply voltages VIH, VIL, and a level of the first power supply voltage VIH is higher than a level of the second power supply voltage VIL. Levels of the first and second power supply voltages VIH, VIL may be adjusted externally, and thus the duplicated test signal DTS may be adjusted to have a voltage level ranging between the first and second power supply voltages VIH, VIL. When the voltage level of the test signal TS does not have sufficient level margin, the duplicated test signal DTS may be adjusted to provide sufficient level margin by adjusting the levels of the first and second power supply voltages VIH, VIL. The relay 112 provides the duplicated test signal DTS to the DUT 31 when a second switching control signal SCS2 is at a first logic level (for example, a logic high level).

The comparison circuit 113 is connected to the DUT 31 through the channel CH1 at a tap TAP1. The comparison circuit 113 compares the test result signal TRS1 from the DUT 31 with a reference level to provide the decision signal DS1 indicating the comparison result to the register 114 when the second switching control signal SCS2 is in a second logic level (for example, logic low level). The comparison circuit 113 is provided with third and fourth power supply voltages VOH, VOL, and a level of the third power supply voltage VOH is higher than a level of the fourth power supply voltage VOL. Levels of the third and fourth power supply voltages VOH, VOL may be adjusted externally, and thus the decision signal DS1 may be adjusted to have a voltage level ranging between the third and fourth power supply voltages VOH, VOL. When the voltage level of the decision signal DS1 does not have sufficient level margin, the decision signal DS1 may be adjusted to provide sufficient level margin by adjusting levels of the third and fourth power supply voltages VOH, VOL.

The register 114 stores the decision signal DS1, and the register 114 outputs the stored decision signal DS1 to the output selection block 200 in response to a register control signal RCS.

With reference to FIG. 2, the architecture and operation of the signal processing unit 110 have been described, and the architecture and operation of the other signal processing units 120, 130, 140 would be substantially the same as the architecture and the operation of the signal processing unit 110. Therefore, detailed description of the architectures and the operations of other signal processing units 120, 130, 140 is omitted. The signal processing unit 120 receives the test result signal TRS2 to provide the decision signal DS2 to the output selection block 200. The signal processing unit 130 receives the test result signal TRS3 to provide the decision signal DS3 to the output selection block 200. The signal processing unit 140 receives the test result signal TRS4 to provide the decision signal DS4 to the output selection block 200. That is, the signal processing units 110, 120, 130, 140 in the signal processing block 100 simultaneously make pass/fail decisions based upon the test result signals TRS1, TRS2, TRS3, TRS4 from the DUTs 31, 32, 33, 34.

Figure 3A:
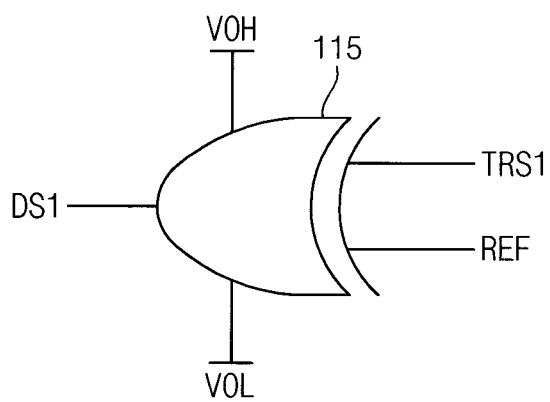
FIGS. 3A and 3B illustrate exemplary embodiments of the comparison circuit in FIG. 2.
Figure 3B:
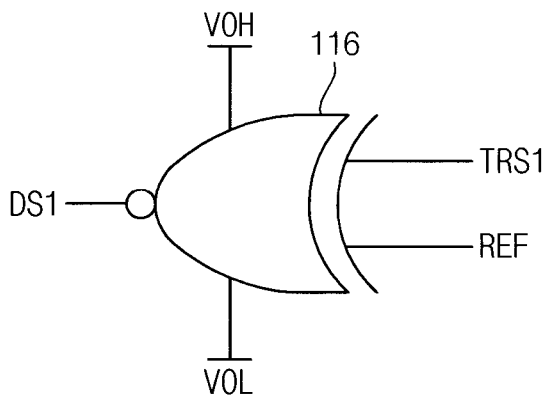

FIGS. 3A and 3B illustrate exemplary embodiments of the comparison circuit 113 of FIG. 2.

In FIG. 3A, a comparison circuit 113a is implemented with a representative exclusive OR gate 115. The exclusive OR gate 115 outputs the decision signal DS1 having a logic low level when the test result signal TRS1 has a same level as the reference level REF, and the exclusive OR gate 115 outputs the decision signal DS1 having a logic high level when the test result signal TRS1 does not have a same level as the reference level REF. Therefore, when the decision signal DS1 has a logic high level, the decision signal DS1 indicates a failed test, and when the decision signal DS1 has a logic low level, the decision signal DS1 indicates a test pass. The reference level REF may be set to have a same level as the test signal TS.

In FIG. 3B, a comparison circuit 113b is implemented with an exclusive NOR gate 116. The exclusive NOR gate 116 outputs the decision signal DS having a logic high level when the test result signal TRS1 has a different level from the reference level REF, and the exclusive NOR gate 116 outputs the decision signal DS having a logic low level when the test result signal TRS1 has a same level as the reference level REF. Therefore, when the decision signal DS1 has a logic low level, the decision signal DS1 indicates a failed test, and when the decision signal DS1 has a logic high level, the decision signal DS1 indicates a test pass. The reference level REF may be similarly set to have a same level as the test signal TS.

FIGS. 4A and 4B are tables illustrating the decision signal DS of FIGS. 3A and 3B based upon the test result signal and the reference level respectively.

Referring to FIGS. 4A and 4B, it is noted that the levels of the decision signal DS indicating the failed test are different from each other for the respective gates of FIGS. 3A and 3B.

Figure 5:
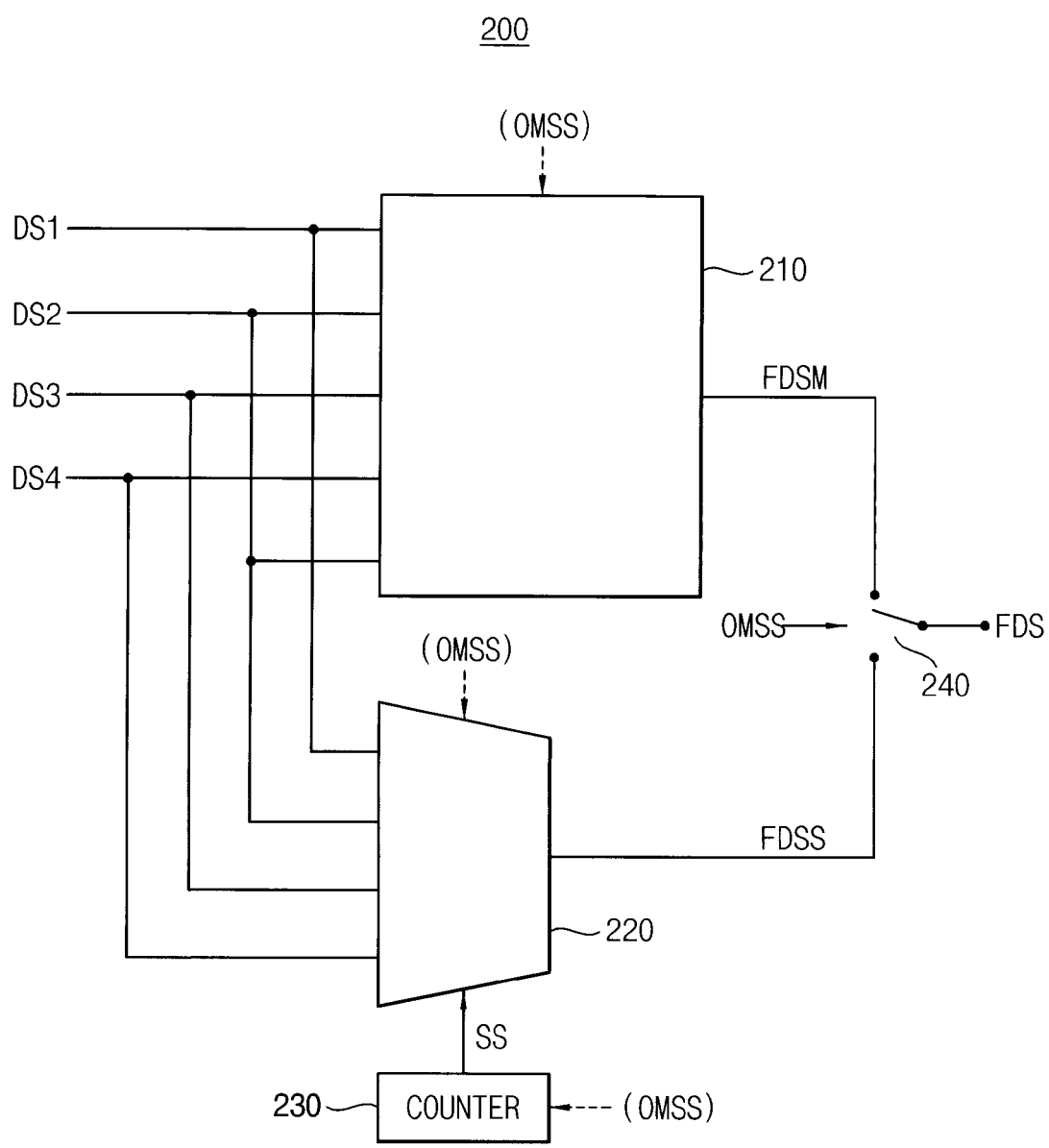
FIG. 5 is a circuit diagram illustrating an exemplary embodiment of the output selection block in FIG. 2.

FIG. 5 is a circuit diagram illustrating an exemplary embodiment of the output selection block 200 of FIG. 1.

Referring to FIG. 5, the output selection block 200 includes a merging circuit 210, a multiplexer 220, a counter 230 and a relay 240. The merging circuit 210 merges decision signals DS1, DS2, DS3, DS4 to provide a merged final decision signal FDSM. The multiplexer 220 selects the decision signals DS1, DS2, DS3, DS4 one by one to output a sequential final decision signal FDSS in response to a selection signal SS from the counter 230. The counter 230 may increase or decrease the selection signal SS one by one. When the counter 230 increases the selection signal SS one by one, the decision signals DS1, DS2, DS3, DS4 may be output in an increasing order. When the counter 230 decreases the selection signal SS one by one, the decision signals DS1, DS2, DS3, DS4 may be output in a decreasing order. When the decision signal DS1 of the decision signals DS1, DS2, DS3, DS4 is selected and the counter 230 increases the selection signal SS one by one, the decision signals DS1, DS2, DS3, DS4 may be output in an order from the decision signal DS1 to the decision signal DS4. When the decision signal DS1 of the decision signals DS1, DS2, DS3, DS4 is selected and the counter 230 decreases the selection signal SS one by one, the decision signals DS1, DS2, DS3, DS4 may be output in an order from the decision signal DS1 through decision signals DS4, DS3 to the decision signal DS2.

The relay 240 is connected to an output of the merging circuit 210 or an output of the multiplexer 220 in response to an output mode selection signal OMSS. For example, when the output mode selection signal OMSS is at a first logic level (for example, logic high level), the relay 240 is connected to the output of the merging circuit 210, and thus, the merged final decision signal FDSM is output as a final decision signal FDS. For example, when the output mode selection signal OMSS is at a second logic level (for example, a logic low level), the relay 240 is connected to the output of the multiplexer 220, and thus, the sequential final decision signal FDSS is output as the final decision signal FDS. In other embodiments, the first logic level may be a logic low level, and the second logic level may be a logic high level.

In an exemplary embodiment the output mode selection signal OMSS may be applied to the merging circuit 210, the multiplexer 220 and the counter 230. When the output mode selection signal OMSS is at a first logic level, the merging circuit 210 may be enabled, and the multiplexer 220 and the counter 230 may be disabled. Therefore, when the output mode selection signal OMSS is at the first logic level, the merged final decision signal FDSM is output as the final decision signal FDS. When the output mode selection signal OMSS is at a second logic level, the merging circuit 210 may be disabled, and the multiplexer 220 and the counter 230 may be enabled. Therefore, when the output mode selection signal OMSS is at the second logic level, the sequential final decision signal FDSS is output as the final decision signal FDS. Accordingly, when the output mode selection signal OMSS is applied to the merging circuit 210, the merged final decision signal FDSM or the sequential final decision signal FDSS may be provided to the relay 21 in FIG. 1 as the final decision signal FDS in response to the output mode selection signal OMSS without including the relay 240.

Figure 6A:
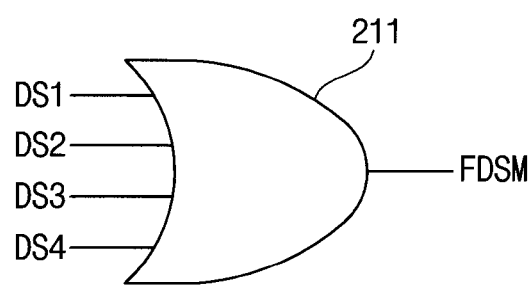
FIGS. 6A and 6B illustrate exemplary embodiments of the merging circuit in FIG. 5.
Figure 6B:
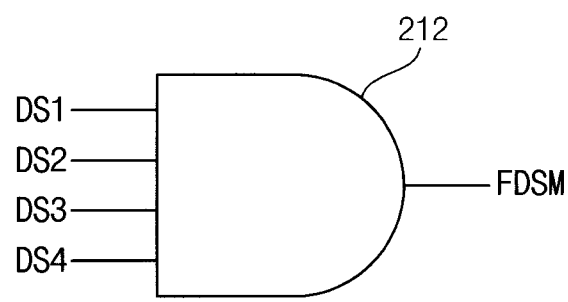

The merging circuit 210 may be implemented with various logic gates and FIGS. 6A and 6B illustrate exemplary embodiments of the merging circuit in FIG. 5.

Referring to FIG. 6A, the merging circuit 210 may include an OR gate 211. The OR gate 211 along with the exclusive OR gate 115 of FIG. 3A may be included in the BOT device 10 of FIG. 1. The OR gate 211 outputs the merged final decision signal FDSM having a logic high level indicating the failed test, when at least one of the decision signals DS1, DS2, DS3, DS4 indicates the failed test (logic high level).

Referring to FIG. 6B, the merging circuit 210 may include an AND gate 212. The AND gate 212 with the exclusive NOR gate 116 of FIG. 3B may be included in the BOT device 10 of FIG. 1. The AND gate 212 outputs the merged final decision signal FDSM having a logic low level indicating the failed test, when at least one of the decision signals DS1, DS2, DS3, DS4 indicates the failed test (logic low level).

FIGS. 7A through 7D are timing diagrams illustrating the operation of the BOT device 10 of FIG. 1.

In FIGS. 7A through 7D, although the test signal TS is illustrated as single pulse signal for convenience, the test signal TS may be various test pattern signals including a series of pulse signals. In addition, for FIGS. 7A and 7B, the comparison circuit 113 is implemented with the exclusive OR gate 115 of FIG. 3A and the merging circuit 210 is implemented with the OR gate 211 of FIG. 6A.

Figure 7A:
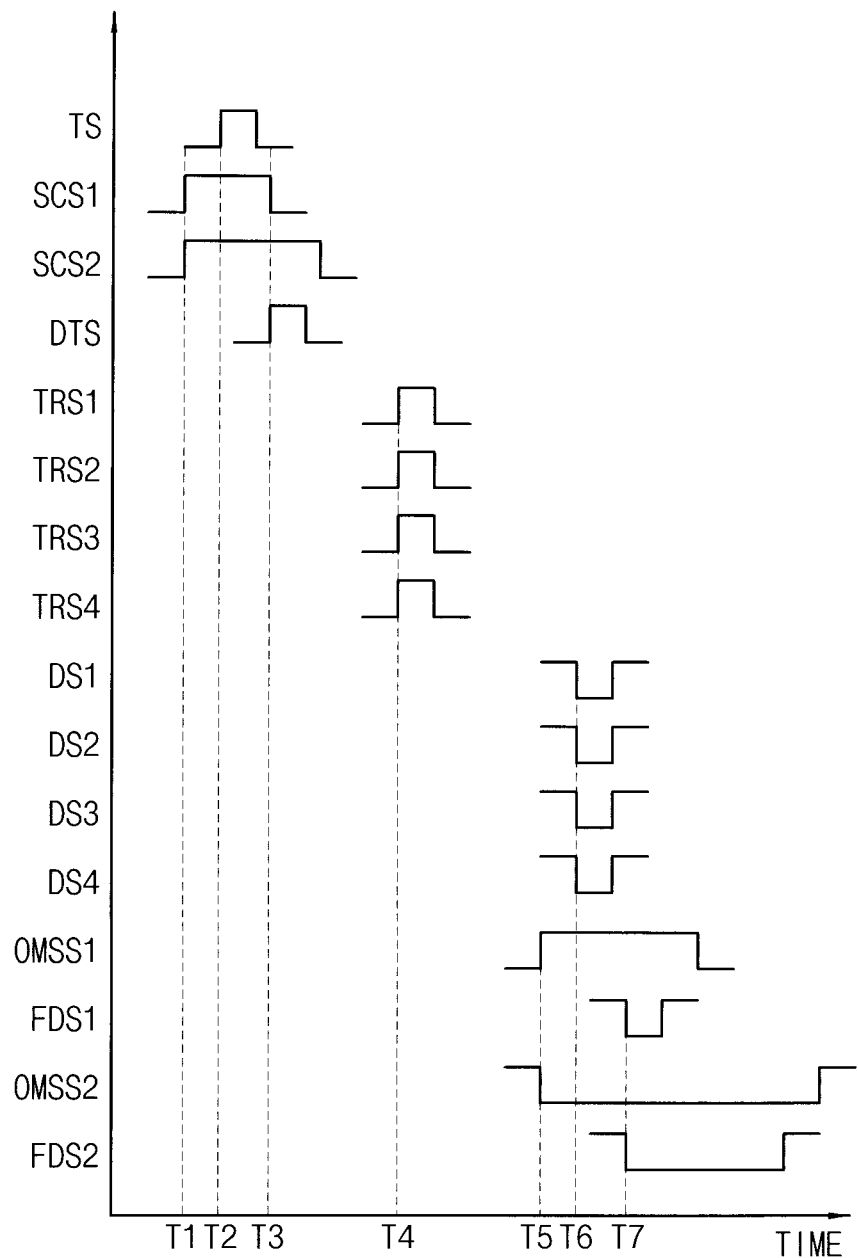
FIGS. 7A, 7B, 7C and 7D are timing diagrams illustrating operation of the BOT device of FIG. 1.

Referring to FIG. 7A, when the first switching control signal SCS1 and the second switching control signal SCS2 transition to a logic high level at time T1, the relay 21 is connected to the signal processing block 100 and the relay 112 is connected to the DUT 31.

At time T2, the test signal TS is applied to the buffer 111 and the test signal TS is duplicated. At time T3, the duplicated test signal DTS1 is applied to the DUT 31. The first switching control signal SCS1 is maintained at a logic high level during a time period long enough for the test signal TS to be applied to the buffer 111, and the second switching control signal SCS2 is maintained at a logic high level during a time period long enough for the duplicated test signal DTS to be applied to the DUT 31.

At time T4, each of the test result signals TRS1, TRS2, TRS3, TRS4 is applied to the respective ones of the signal processing units 110, 120, 130, 140. Each of the test result signals TRS1, TRS2, TRS3, TRS4 has a logic high level. At time T5, the output mode selection signal OMSS1 transitions to a logic high level, and the relay 240 is connected to the output of the merging circuit 240. At time T6, the decision signals DS1, DS2, DS3, DS4 are applied to the output selection block 200. Each of the decision signals DS1, DS2, DS3, DS4 has a logic low level indicating that test passes. Therefore, at time T7, the merged final decision signal FDS1 having a logic low level is provided at the relay 240 as the final decision signal FDS. When the output mode selection signal OMSS2 transitions to a logic low level at the time T5, the relay 240 is connected to the multiplexer 220. Therefore, at the time T7, the decision signals DS1, DS2, DS3, DS4 are sequentially output one by one, and thus, the sequential final decision signal FDS2 is provided at the relay 240 as the final decision signal FDS.

Figure 7B:
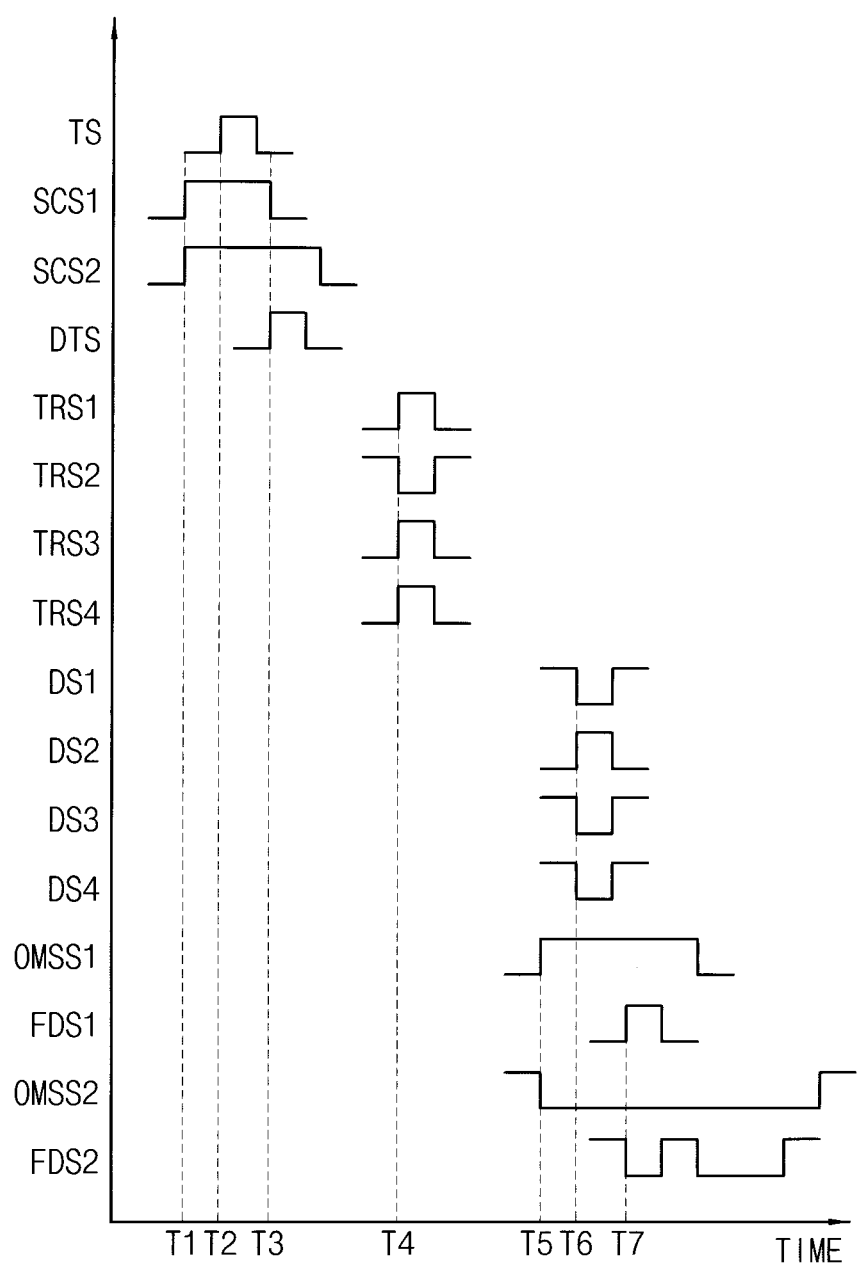

Referring to FIG. 7B, at the time T4, the test result signal TRS2 has a logic low level indicating a failed test, and thus, the decision signal DS2 has a logic high level at the time T6. Therefore, the merged final decision signal FDS1 having a logic high level indicating the failed test is provided at the relay 240 at the time T7. When the output mode selection signal OMSS1 transitions to a logic low level at the time T5, the relay 240 is connected to the multiplexer 220. Therefore, at the time T7, the decision signals DS1, DS2, DS3, DS4 are sequentially output one by one, and thus, the sequential final decision signal FDS2 is provided at the relay 240.

Figure 7C:
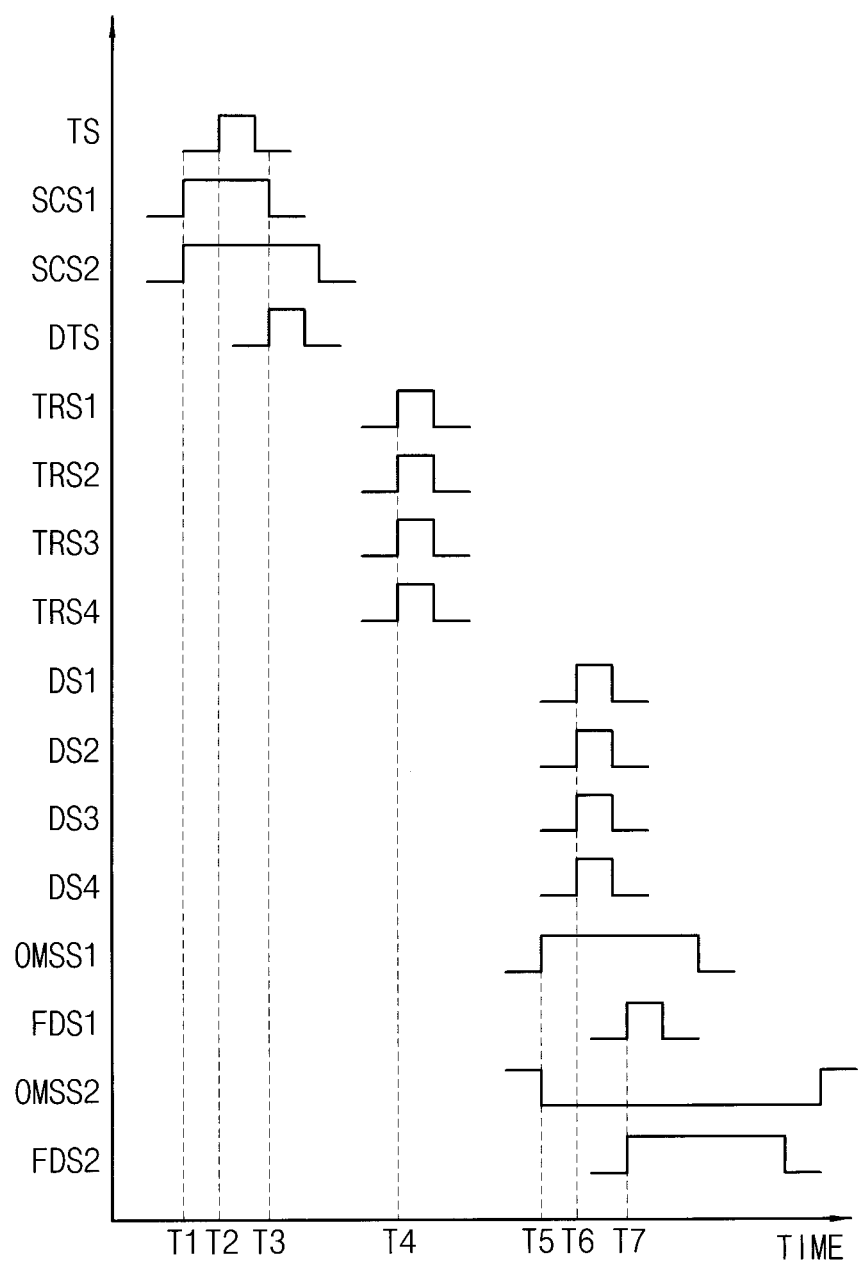
Figure 7D:
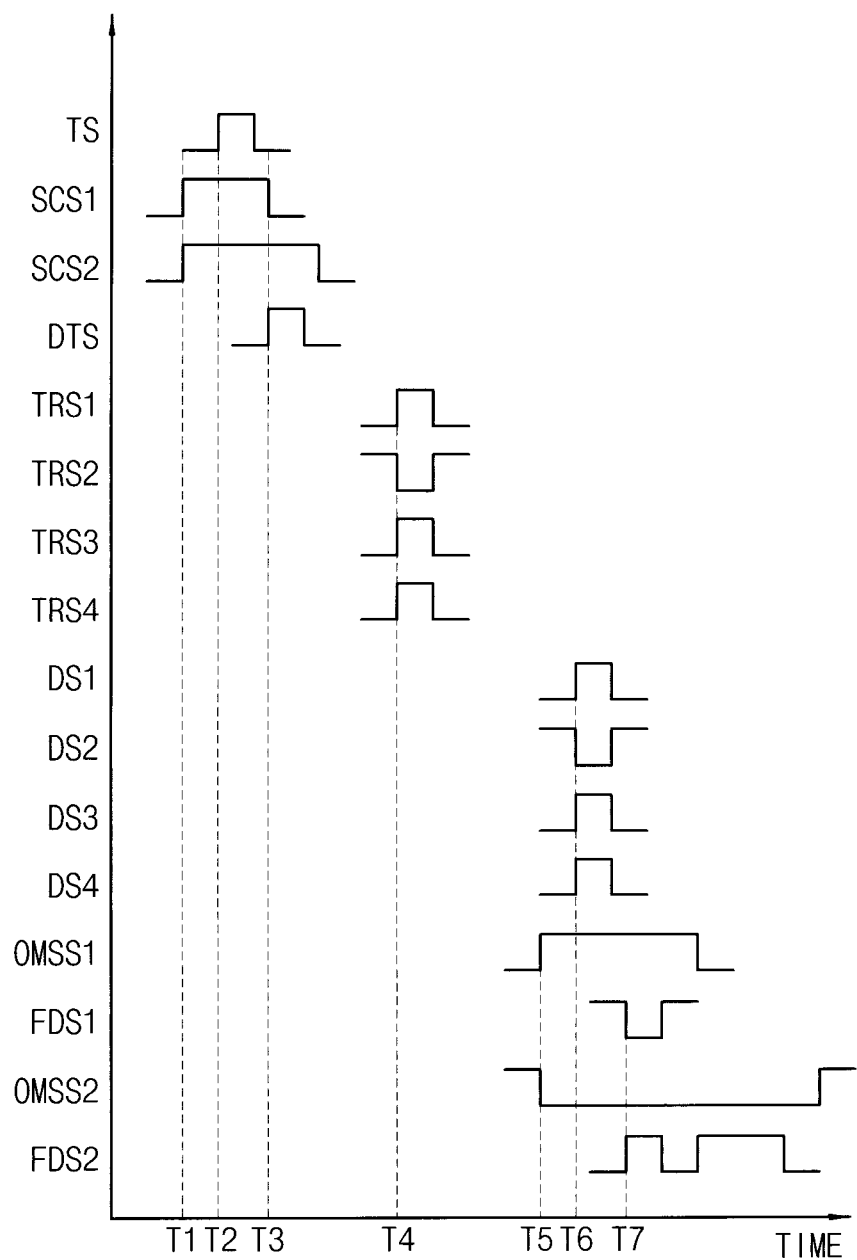

In FIGS. 7C and 7D, it is assumed that the comparison circuit 113 is implemented with the exclusive NOR gate 116 of FIG. 3B and the merging circuit 210 is implemented with the AND gate 212 of FIG. 6B.

Referring to FIG. 7C, each of the test result signals TRS1, TRS2, TRS3, TRS4 transitions to a logic high level. At the time T5, the output mode selection signal OMSS1 transitions to a logic high level, and the relay 240 is connected to the output of the merging circuit 240. At the time T6, the decision signals DS1, DS2, DS3, DS4 are applied to the output selection block 200. Each of the decision signals DS1, DS2, DS3, DS4 has a logic high level indicating that test passes. Therefore, at the time T7, the merged final decision signal FDS1 having a logic high level is provided at the relay 240 as the final decision signal FDS. When the output mode selection signal OMSS2 transitions to a logic low level at the time T5, the relay 240 is connected to the multiplexer 220. Therefore, at the time T7, the decision signals DS1, DS2, DS3, DS4 are sequentially output one by one, and thus, the sequential final decision signal FDS2 is provided at the relay 240 as the final decision signal FDS.

Referring to FIG. 7D, at the time T4, the test result signal TRS2 has a logic low level indicating a failed test, and thus, the decision signal DS2 has a logic low level at the time T6. Therefore, the merged final decision signal FDS1 having a logic low level indicating the failed test is provided at the relay 240 at the time T7. When the output mode selection signal OMSS1 transitions to a logic low level at the time T5, the relay 240 is connected to the multiplexer 220. Therefore, at the time T7, the decision signals DS1, DS2, DS3, DS4 are sequentially output one by one, and thus, the sequential final decision signal FDS2 is provided at the relay 240.

Figure 8:
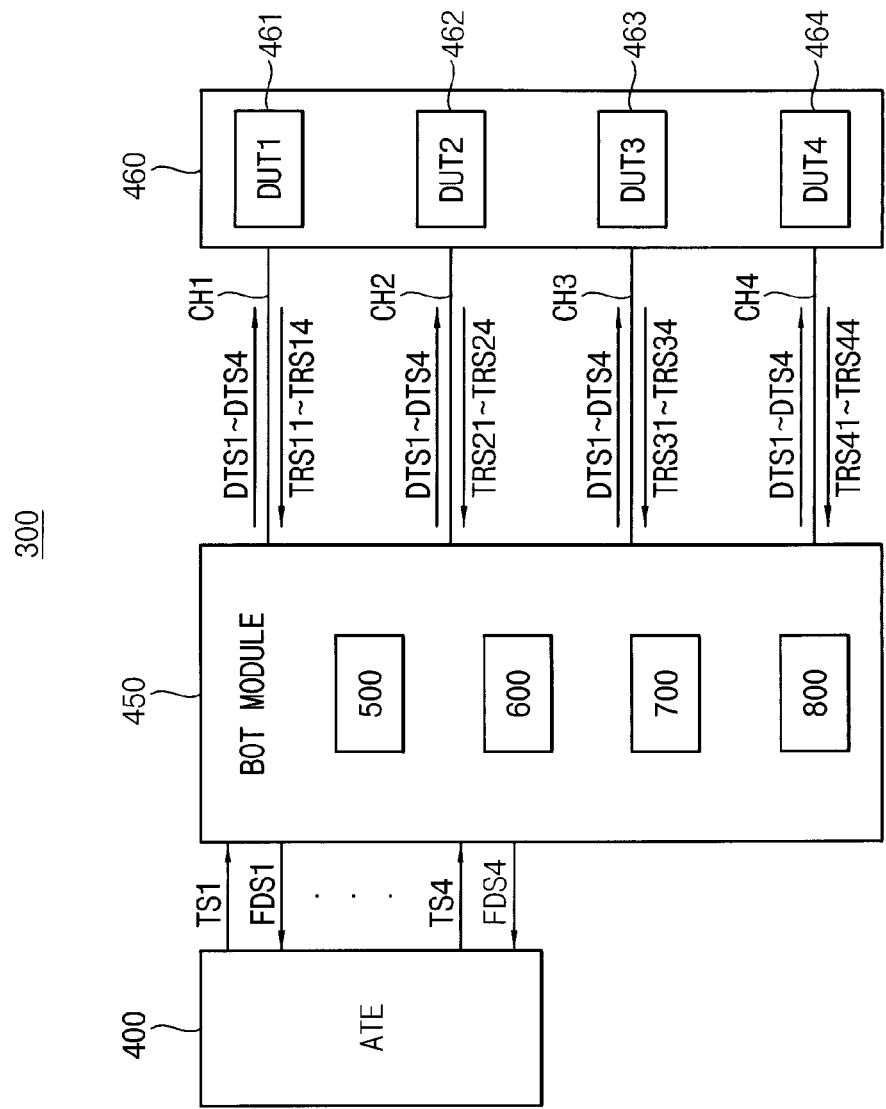
FIG. 8 is a block diagram illustrating a test system according to an exemplary embodiment.

FIG. 8 is a block diagram illustrating a test system according to an exemplary embodiment.

Referring to FIG. 8, a test system 300 includes a test device 400 such as an automatic test equipment (ATE), a BOT module 450 and a test board 460. A plurality of DUTs 461, 462, 463, 464 are mounted on the test board 460. Each of the DUTs 461, 462, 463, 464 may be a memory device, but are not limited to memory devices.

The test device 400 provides a plurality of test signals TS1, . . . TS4 to the BOT module 450 and each of the test signals TS1, . . . TS4 may be associated with each of a plurality of test parameters. The test signal TS1 may be associated with data DQ, the test signal TS2 may be associated with a data strobe signal DQs, the test signal TS3 may be associated with command/address, and the test signal TS4 may be associated with a clock signal CK. Architectural and operational details of the test device will be described below with reference to FIG. 9.

The BOT module 450 duplicates each of the test signals TS1, . . . TS4 to provide duplicated test signals DTS1~DTS4 to each of the respective DUTs 461, 462, 463, 464 through respective ones of a plurality of channels CH1, CH2, CH3, CH4. In addition, the BOT module 450 receives a plurality of test result signals TRS11~TRS14, TRS21~TRS24, TRS31~TRS34 and TRS41~TRS44 from the DUTs 461, 462, 463, 464 through the channels CH1, CH2, CH3, CH4, and provides a plurality of final decision signals FDS1, . . . FDS4 to the test device 400 based upon the test result signals TRS11~TRS14, TRS21~TRS24, TRS31~TRS34 and TRS41~TRS44. In addition, the BOT module 450 includes a plurality of BOT units 500, 600, 700, 800. Architectural and operational details of the BOT module 450 and the BOT units 500, 600, 700, 800 will be described below with reference to FIG. 10.

Figure 9:
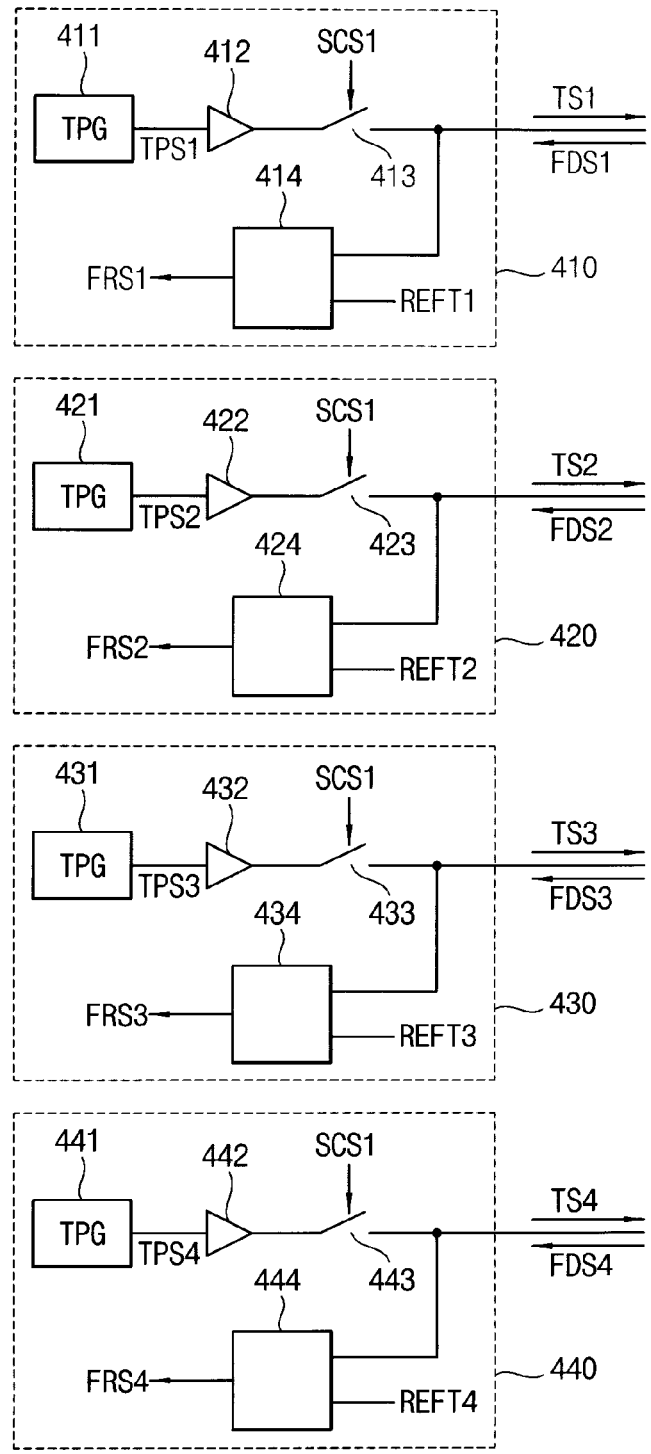
FIG. 9 is a block diagram illustrating an exemplary embodiment of the test device in FIG. 8.

FIG. 9 is a block diagram illustrating an exemplary embodiment of the test device 400 of FIG. 8.

Referring to FIG. 9, the test device 400 includes a plurality of signal generating circuits 410, 420, 430, 440.

The signal generating circuit 410 includes a test pattern generator 411, a buffer 412, a relay 413 and a comparison circuit 414. The test pattern generator 411 generates a test pattern signal TPS1. The test pattern signal TPS1 may be associated with the data DQ. The buffer 412 buffers the test pattern signal TPS1 to provide the test signal TS1. The relay 413 provides the test signal TS1 to the BOT module 450 when a first switching control signal SCS1 is at a first logic level (for example, logic high level). The comparison circuit 414 compares the final decision signal FDS1 with a reference level REFT1 to provide a final result signal FRS1 when the first switching control signal SCS1 is at a second logic level (for example, logic low level). The final decision signal FDS1 may be associated with the data DQ.

The signal generating circuit 420 includes a test pattern generator 421, a buffer 442, a relay 423 and a comparison circuit 424. The test pattern generator 421 generates a test pattern signal TPS2. The test pattern signal TPS2 may be associated with the data strobe DQs. The buffer 422 buffers the test pattern signal TPS2 to provide the test signal TS2. The relay 423 provides the test signal TS2 to the BOT module 450 when the first switching control signal SCS1 is at a first logic level (for example, logic high level). The comparison circuit 424 compares the final decision signal FDS2 with a reference level REFT2 to provide a final result signal FRS2 when the first switching control signal SCS2 is at a second logic level (for example, logic low level). The final decision signal FDS2 may be associated with the data strobe DQs.

The signal generating circuit 430 includes a test pattern generator 431, a buffer 432, a relay 433 and a comparison circuit 434. The test pattern generator 431 generates a test pattern signal TPS3. The test pattern signal TPS3 may be associated with the command/address. The buffer 432 buffers the test pattern signal TPS3 to provide the test signal TS3. The relay 433 provides the test signal TS3 to the BOT module 450 when the first switching control signal SCS1 is at a first logic level (for example, logic high level). The comparison circuit 434 compares the final decision signal FDS3 with a reference level REFT3 to provide a final result signal FRS3 when the first switching control signal SCS1 is at a second logic level (for example, logic low level). The final decision signal FDS3 may be associated with the command/address.

The signal generating circuit 440 includes a test pattern generator 441, a buffer 442, a relay 443 and a comparison circuit 444. The test pattern generator 441 generates a test pattern signal TPS4. The test pattern signal TPS4 may be associated with the clock signal CK. The buffer 442 buffers the test pattern signal TPS4 to provide the test signal TS4. The relay 443 provides the test signal TS4 to the BOT module 450 when the first switching control signal SCS1 is at a first logic level (for example, logic high level). The comparison circuit 444 compares the final decision signal FDS4 with a reference level REFT3 to provide a final result signal FRS4 when the first switching control signal SCS1 is at a second logic level (for example, logic low level). The final decision signal FDS4 may be associated with the clock signal CK.

Figure 10:
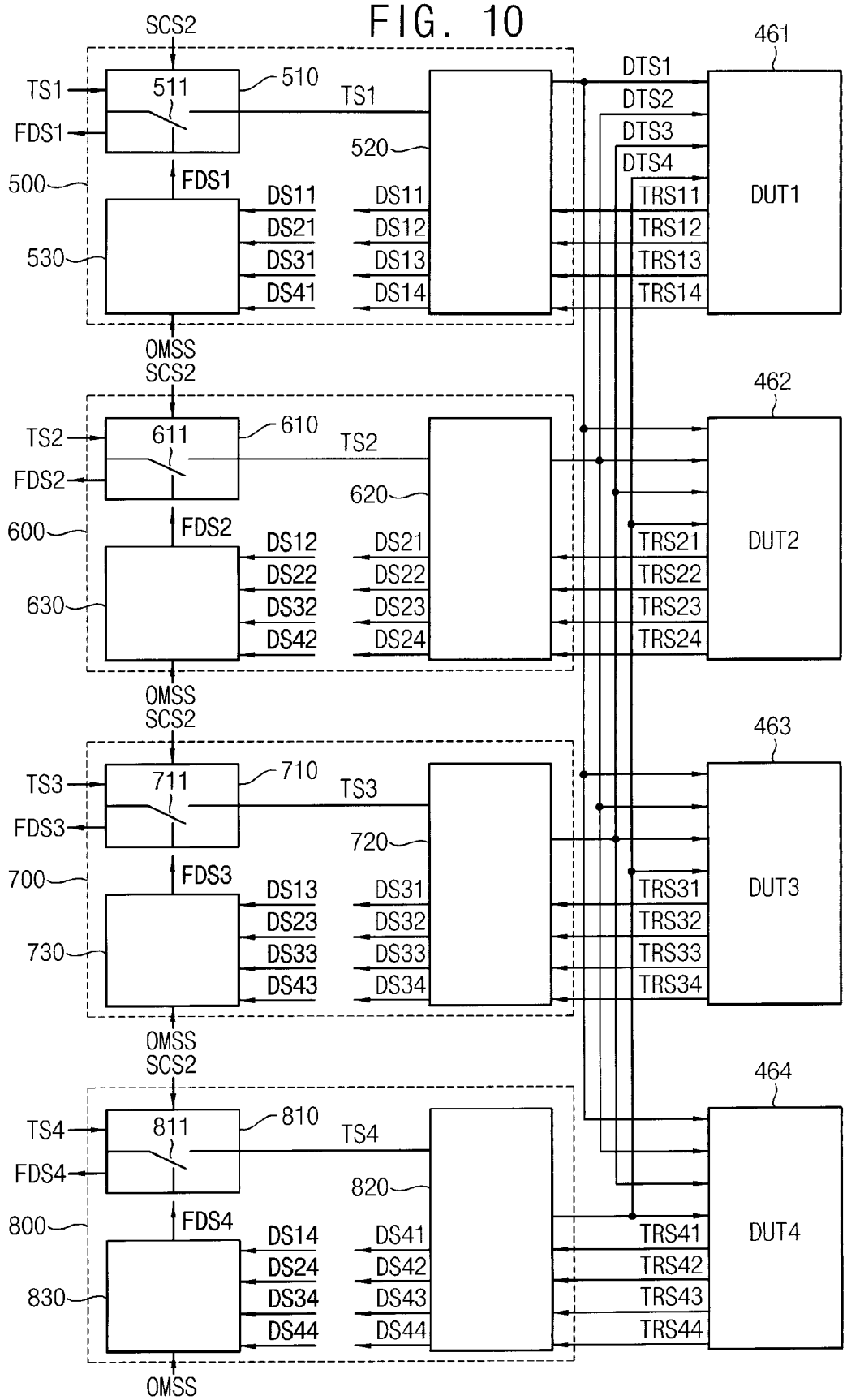
FIG. 10 is a block diagram illustrating an exemplary embodiment of BOT module in FIG. 8.

FIG. 10 is a block diagram illustrating an exemplary embodiment of the BOT module 450 of FIG. 8 according to an exemplary embodiment.

Referring to FIG. 10, the BOT module 450 includes a plurality of BOT units 500, 600, 700, 800.

The BOT unit 500 includes a signal control block 510 having a relay 511, a signal processing block 520 and an output selection block 530. The signal processing block 520 duplicates the test signal TS1 to provide the duplicated test signal DTS1 to each of the DUTs 461, 462, 463, 464. In addition, the signal processing block 520 receives the test result signals TRS11, TRS12, TRS13, TRS14 from the DUT 461 and provides a plurality of decision signals DS11, DS12, DS13, DS14 based upon the test result signals TRS11, TRS12, TRS13, TRS14. The output selection block 530 merges the decision signals DS11, DS21, DS31, DS41 of the decision signals DS11, DS12, DS13, DS14, DS21, DS22, DS23, DS24, DS31, DS32, DS33, DS34, DS41, DS42, DS43, DS44 to provide the final decision signal FDS1 or sequentially outputs the decision signals DS11, DS21, DS31, DS41 one by one as the final decision signal FDS1. The decision signals DS11, DS21, DS31, DS41 may be associated with one of the test parameters (for example, the data DQ). The signal control block 510 connects the test signal TS1 to the signal processing block 520 or connects the final decision signal FDS1 to the comparison circuit 414 in FIG. 9, in response to a second switching control signal SCS2. When the second switching control signal SCS2 is at a first logic level (for example, logic high level), the test signal TS1 is provided to the signal processing block 520. When the second switching control signal SCS2 is at a second logic level (for example, logic low level), the final decision signal FDS1 is provided to the comparison circuit 414 in FIG. 9.

The BOT unit 600 includes a signal control block 610 having a relay 611, a signal processing block 620 and an output selection block 630. The signal processing block 620 duplicates the test signal TS2 to provide the duplicated test signal DTS2 to each of the DUTs 461, 462, 463, 464. In addition, the signal processing block 620 receives the test result signals TRS21, TRS22, TRS23, TRS24 from the DUT 462 and provides a plurality of decision signals DS21, DS22, DS23, DS24 based upon the test result signals TRS21, TRS22, TRS23, TRS24. The output selection block 630 merges the decision signals DS12, DS22, DS32, DS42 of the decision signals DS11, DS12, DS13, DS14, DS21, DS22, DS23, DS24, DS31, DS32, DS33, DS34, DS41, DE42, DS43, DS44 to provide the final decision signal FDS2 or sequentially outputs the decision signals DS12, DS22, DS32, DS42 one by one as the final decision signal FDS2. The decision signals DS12, DS22, DS32, DS42 may be associated with one of the test parameters (for example, the data strobe DQs). The signal control block 610 connects the test signal TS2 to the signal processing block 620 or connects the final decision signal FDS2 to the comparison circuit 424 in FIG. 9, in response to the second switching control signal SCS2. When the second switching control signal SCS2 is at a first logic level (for example, logic high level), the test signal TS2 is provided to the signal processing block 620. When the second switching control signal SCS2 is at a second logic level (for example, logic low level), the final decision signal FDS2 is provided to the comparison circuit 424 in FIG. 9.

The BOT unit 700 includes a signal control block 710 having a relay 711, a signal processing block 720 and an output selection block 730. The signal processing block 720 duplicates the test signal TS3 to provide the duplicated test signal DTS3 to each of the DUTs 461, 462, 463, 464. In addition, the signal processing block 720 receives the test result signals TRS31, TRS32, TRS33, TRS34 from the DUT 463 and provides a plurality of decision signals DS31, DS32, DS33, DS34 based upon the test result signals TRS31, TRS32, TRS33, TRS34. The output selection block 730 merges the decision signals DS13, DS23, DS33, DS43 of the decision signals DS11, DS12, DS13, DS14, DS21, DS22, DS23, DS24, DS31, DS32, DS33, DS34, DS41, DS42, DS43, DS44 to provide the final decision signal FDS3 or sequentially outputs the decision signals DS13, DS23, DS33, DS43 one by one as the final decision signal FDS3. The decision signals DS13, DS23, DS33, DS43 may be associated with one of the test parameters (for example, the command/address). The signal control block 710 connects the test signal TS3 to the signal processing block 720 or connects the final decision signal FDS3 to the comparison circuit 434 in FIG. 9, in response to the second switching control signal SCS2. When the second switching control signal SCS2 is at a first logic level (for example, logic high level), the test signal TS3 is provided to the signal processing block 720. When the second switching control signal SCS2 is at a second logic level (for example, logic low level), the final decision signal FDS3 is provided to the comparison circuit 434 in FIG. 9.

The BOT unit 800 includes a signal control block 810 having a relay 811, a signal processing block 820 and an output selection block 830. The signal processing block 820 duplicates the test signal TS4 to provide the duplicated test signal DTS4 to each of the DUTs 461, 462, 463, 464. In addition, the signal processing block 820 receives the test result signals TRS41, TRS42, TRS43, TRS44 from the DUT 464 and provides a plurality of decision signals DS41, DS42, DS43, DS44 based upon the test result signals TRS41, TRS42, TRS43, TRS44. The output selection block 830 merges the decision signals DS14, DS24, DS34, DS44 of the decision signals DS11, DS12, DS13, DS14, DS21, DS22, DS23, DS24, DS31, DS32, DS33, DS34, DS41, DS42, DS43, DS44 to provide the final decision signal FDS4 or sequentially outputs the decision signals DS14, DS24, DS34, DS44 one by one as the final decision signal FDS4. The decision signals DS14, DS24, DS34, DS44 may be associated with one of the test parameters (for example, the clock signal CK). The signal control block 810 connects the test signal TS4 to the signal processing block 820 or connects the final decision signal FDS4 to the comparison circuit 444 in FIG. 9, in response to the second switching control signal SCS2. When the second switching control signal SCS2 is at a first logic level (for example, logic high level), the test signal TS4 is provided to the signal processing block 820. When the second switching control signal SCS2 is at a second logic level (for example, logic low level), the final decision signal FDS4 is provided to the comparison circuit 444 in FIG. 9.

Figure 11:
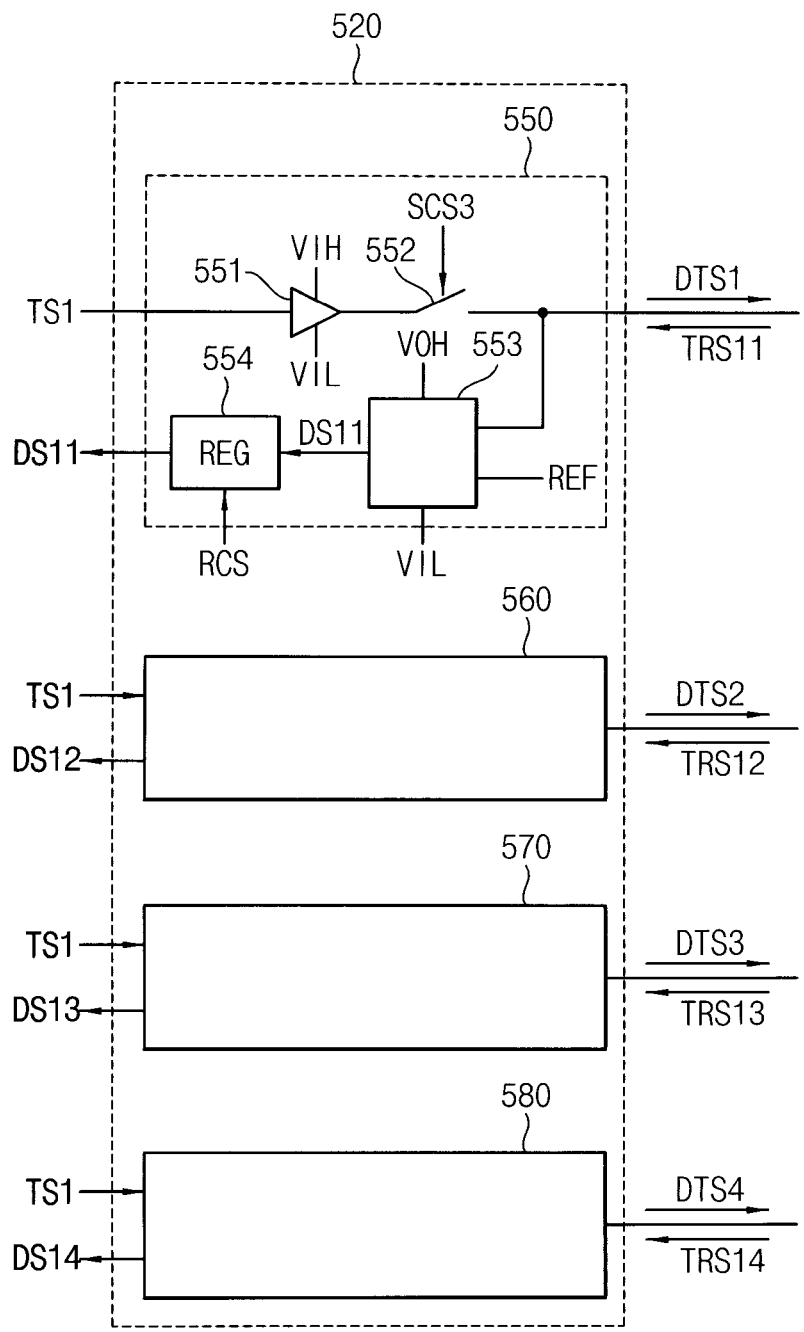
FIG. 11 is a block diagram illustrating an exemplary embodiment of the signal processing block in BOT unit in FIG. 9.

FIG. 11 is a block diagram illustrating an exemplary embodiment of the signal processing block in BOT unit 520 in FIG. 10.

Referring to FIG. 11, the signal processing block 520 includes a plurality of signal processing units 550, 560, 570, 580. In FIG. 11, the signal processing unit 550 is illustrated in detail, and each of the signal processing units 560, 570, 580 may have substantially the same structure as the signal processing unit 550.

The signal processing unit 550 includes a buffer 551, a relay 552, a comparison circuit 553 and a register 554. The buffer 551 buffers (or duplicates) the test signal TS1 to output the duplicated test signal DTS1. The buffer 551 is provided with first and second power supply voltages VIH, VIL, and a level of the first power supply voltage VIH is higher than a level of the second power supply voltage VIL. Levels of the first and second power supply voltages VIH, VIL may be adjusted externally, and thus the duplicated test signal DTS1 may be adjusted to have a voltage level ranging between the first and second power supply voltages VIH, VIL. When voltage level of the test signal TS1 does not have sufficient level margin, the duplicated test signal DTS1 may be adjusted to have sufficient level margin by adjusting levels of the first and second power supply voltages VIH, VIL. The relay 552 provides the duplicated test signal DTS1 to the DUT 31 when a third control signal SCS3 is at a first logic level (for example, logic high level).

The comparison circuit 553 compares the test result signal TRS11 with the reference level to provide the decision signal DS11 indicating the comparison result to the register 554 when the third switching control signal SCS3 is at a second logic level (for example, logic low level). The comparison circuit 553 is provided with third and fourth power supply voltages VOH, VOL, and a level of the third power supply voltage VOH is higher than a level of the fourth power supply voltage VOL. Levels of the third and fourth power supply voltages VOH, VOL may be adjusted externally, and thus the decision signal DS11 may be adjusted to have a voltage level ranging between the third and fourth power supply voltages VOH, VOL. When the voltage level of the decision signal DS11 does not have a sufficient level margin, the decision signal DS11 may be adjusted to provide a sufficient level margin by adjusting levels of the third and fourth power supply voltages VOH, VOL.

The register 554 stores the decision signal DS11, and the register 554 outputs the stored decision signal DS11 to the output selection block 530 in FIG. 10 in response to a register control signal RCS.

With reference to FIG. 11, architecture and operation of the signal processing unit 550 are described, and architectures and operations of other signal processing units 560, 570, 580 are substantially the same as the architecture and the operation of the signal processing unit 550. Therefore, detailed description of the architectures and the operations of other signal processing units 560, 570, 580 will be omitted. The signal processing unit 560 receives the test result signal TRS12 to provide the decision signal DS12 to the output selection block 530. The test result signal TRS12 indicates the test result in the DUT 461 in response to the duplicated test signal DTS2. The signal processing unit 570 receives the test result signal TRS13 to provide the decision signal DS13 to the output selection block 530. The test result signal TRS13 indicates the test result in the DUT 461 in response to the duplicated test signal DTS3. The signal processing unit 580 receives the test result signal TRS14 to provide the decision signal DS14 to the output selection block 530. The test result signal TRS14 indicates the test result in the DUT 461 in response to the duplicated test signal DTS4.

The signal processing unit 520 duplicates the test signal TS1 associated with one test parameter (for example, the data DQ), and provides the duplicated test signal DTS1 to each of the DUTs 461, 462, 463, 464. In addition, the signal processing unit 520 receives the test result signals TRS11~TRS14, each associated with each of the test parameters, from the one DUT 461 to provide the decision signals DS11~DS14, each associated with each of the test parameters based upon the test result signals TRS11~TRS14. Each of the output selection blocks 530, 630, 730, 830 merges the decision signals, each provided from different DUTs 461, 462, 463, 464 and each associated with the same test parameter, or sequentially outputs the decision signals one by one, each provided from different DUTs 461, 462, 463, 464 and each associated with the same test parameter as the final decision signal.

The BOT module 450 may operate as an interface between the test device 400 and the test board 460. The BOT module 450 may be mounted on the test device 400, or the BOT module 450 may be mounted on the test board 460.

The BOT device according to the exemplary embodiments may reduce test time when a number of DUTs increases by duplicating limited test signals to provide the duplicated test signals to DUTs, simultaneously determining the test result signals from the DUTs and providing the final decision signal to the test device after the test is completed. In addition, the BOT device may operate as an interface between the test device and the test board, and thus, the conventional test device which is very expensive may be employed without being modified. Therefore, test performance may be enhanced and a number of DUTs which are capable of simultaneously being tested may be increased without increasing test cost. Accordingly, the BOT device according to exemplary embodiments may be widely employed in memory test situations.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, the exemplary embodiments, modifications to the disclosed exemplary embodiments, as well as other exemplary embodiments, are intended to be included within the scope of the appended claims.

What is claimed is:

1. A built-off test device, comprising:
a signal processing block configured to duplicate a test signal, to apply a plurality of duplicated test signals to each of a plurality of devices under test through each of corresponding channels, and to provide a plurality of decision signals based upon a plurality of test result signals being received from each of the devices under test;
an output selection block configured to merge the decision signals as a final decision signal or to sequentially output the decision signals as the final decision signal, in response to an output mode selection signal; and
a signal control block configured to provide the test signal to the signal processing block or to provide the final decision signal externally, in response to a first switching control signal,
wherein the signal processing block includes a plurality of signal processing units, each of the signal processing units comprising:
a buffer that duplicates the test signal to provide the duplicated test signal;
a relay that provides the duplicated test signal to the corresponding device under test when a second switching control signal is at a first logic level;
a comparison circuit that compares the corresponding test result signal with a reference level to provide the corresponding decision signal when the second switching control signal is at a first logic level; and
a register that stores and outputs the decision signal,
wherein the buffer is provided with first and second power supply voltages, and a voltage level of the duplicated test signal is adjustable according to the first and second power supply voltages.

2. The built-off test device of claim 1, wherein the decision signal stored in the register is provided to the output selection block when a test of all the devices under test is completed.

3. The built-off test device of claim 1, wherein the comparison circuit is provided with third and fourth power supply voltages, and a voltage level of the decision signal is adjustable according to the third and fourth supply voltages.

4. The built-off test device of claim 1, wherein the comparison circuit provides the decision signal that indicates a failed test when the test result signal is the same as the reference level.

5. The built-off test device of claim 1, wherein the comparison circuit provides the decision signal that indicates a failed test when the test result signal is different from the reference level.

6. The built-off test device of claim 1, wherein the output selection block merges the test result signals as the final decision signal when the output mode selection signal is at a first logic level and sequentially outputs the test result signals as the final decision signal when the output mode selection signal is at a second level.

7. The built-off test device of claim 6, wherein the output selection block includes:
a merging circuit configured to receive and merge the plurality of decision signals;

a multiplexer configured to select and sequentially output one of the plurality of decision signals in response to a selection signal;

a counter that generates the selection signal; and a relay connected to an output of the merging circuit when the output mode selection signal is at the first logic level, and connected to an output of the multiplexer when the output mode selection signal is at the second logic level.

8. The built-off test device of claim 7, wherein the merging circuit includes an OR gate that outputs the final decision signal of a first logic level that indicates a failed test when at least one of test signals is at the first logic level.

9. The built-off test device of claim 7, wherein the merging circuit includes an AND gate that outputs the final decision signal of a second logic level that indicates a failed test when at least one of test signals is at the second logic level.

10. The built-off test device of claim 6, wherein the output selection block includes:

a merging circuit configured to be selectively enabled in response to the output mode selection signal and to receive and merge the plurality of decision signals;

a multiplexer configured to be selectively enabled in response to the output mode selection signal and to select and sequentially output one of the plurality of decision signals in response to a selection signal; and a counter which is selectively enabled in response to the output mode selection signal and generates the selection signal.

11. The built-off test device of claim 10, wherein the merging circuit is enabled when the output mode selection signal is at the first logic level, and the multiplexer and the counter are enabled when the output mode selection signal is at the second logic level.

12. Apparatus for testing multiple semiconductor devices, comprising:

a signal processor coupled through respective channels to a plurality of semiconductor devices;

a signal controller configured to, in response to a switching control signal:

selectively supply to the signal processor a common test signal for processing by each of the plurality of semiconductor devices, or externally provide a final decision signal based upon the common test signal having been processed by the semiconductor devices; and an output selector configured to, in response to an output mode selection signal, provide the final decision signal to the signal controller, wherein the final decision signal is either a one by one sequence of test result decision signals or a merger of the test result decision signals to indicate a failed test of at least one of the semiconductor devices, and wherein each test result decision signal is based upon a comparison between a reference level and a test result signal from a respective semiconductor device having processed the common test signal, wherein the signal processing block includes a plurality of signal processing units, each of the signal processing units comprising:

a buffer that duplicates the test signal to provide the duplicated test signal;

a relay that provides the duplicated test signal to the corresponding device under test when a second switching control signal is at a first logic level;

a comparison circuit that compares the corresponding test result signal with a reference level to provide the corresponding decision signal when the second switching control signal is at a first logic level; and a register that stores and outputs the decision signal, wherein the buffer is provided with first and second power supply voltages, and a voltage level of the duplicated test signal is adjustable according to the first and second power supply voltages.

* * * * *